US008715907B2

(12) United States Patent
Chen et al.

(10) Patent No.: US 8,715,907 B2
(45) Date of Patent: May 6, 2014

(54) DEVELOPABLE BOTTOM ANTIREFLECTIVE COATING COMPOSITIONS FOR NEGATIVE RESISTS

(75) Inventors: Kuang-Jung Chen, Poughkeepsie, NY (US); Steven J. Holmes, Guilderland, NY (US); Wu-Song Huang, Brewster, NY (US); Sen Liu, Highland Park, NJ (US)

(73) Assignee: International Business Machines Corporation, Armonk, NY (US)

( * ) Notice: Subject to any disclaimer, the term of this patent is extended or adjusted under 35 U.S.C. 154(b) by 51 days.

(21) Appl. No.: 13/206,796

(22) Filed: Aug. 10, 2011

(65) Prior Publication Data

US 2013/0040238 A1   Feb. 14, 2013

(51) Int. Cl.
*G03F 7/09* (2006.01)
*G03F 7/11* (2006.01)
*G03F 7/30* (2006.01)

(52) U.S. Cl.
USPC .................... 430/273.1; 430/271.1; 430/325

(58) Field of Classification Search
None
See application file for complete search history.

(56) References Cited

U.S. PATENT DOCUMENTS

| | | | | |
|---|---|---|---|---|
| 5,585,222 | A * | 12/1996 | Kaimoto et al. | 430/296 |
| 5,886,102 | A * | 3/1999 | Sinta et al. | 525/154 |
| 6,242,161 | B1 * | 6/2001 | Kawaguchi et al. | 430/313 |
| 6,602,652 | B2 | 8/2003 | Adams et al. | |
| 6,677,106 | B2 * | 1/2004 | Blum et al. | 430/302 |
| 6,733,935 | B2 * | 5/2004 | Kishimoto et al. | 430/7 |
| 6,844,131 | B2 | 1/2005 | Oberlander et al. | |
| 7,879,530 | B2 | 2/2011 | Tachibana et al. | |
| 7,906,270 | B2 | 3/2011 | Paxton et al. | |
| 8,497,062 | B2 | 7/2013 | Natsume et al. | |
| 2002/0172896 | A1 | 11/2002 | Adams et al. | |
| 2003/0129531 | A1 | 7/2003 | Oberlander et al. | |
| 2003/0215736 | A1 | 11/2003 | Oberlander et al. | |
| 2006/0063105 | A1 | 3/2006 | Oberlander et al. | |
| 2006/0189146 | A1 | 8/2006 | Oweyang et al. | |
| 2007/0228365 | A1 * | 10/2007 | Jung | 257/40 |
| 2007/0243484 | A1 | 10/2007 | Chen et al. | |
| 2008/0138744 | A1 * | 6/2008 | Hatanaka et al. | 430/319 |
| 2009/0087799 | A1 | 4/2009 | Tachibana et al. | |
| 2009/0098490 | A1 | 4/2009 | Pham et al. | |
| 2009/0104559 | A1 | 4/2009 | Houlihan et al. | |
| 2009/0162796 | A1 * | 6/2009 | Yun et al. | 430/319 |
| 2009/0291392 | A1 | 11/2009 | Chen et al. | |
| 2010/0112475 | A1 | 5/2010 | Natsume et al. | |
| 2010/0119972 | A1 | 5/2010 | Houlihan et al. | |
| 2010/0196825 | A1 | 8/2010 | Huang et al. | |

FOREIGN PATENT DOCUMENTS

| | | |
|---|---|---|
| CA | 1204547 | 5/1986 |
| JP | 1-293339 | 11/1989 |
| WO | 2009/053832 A2 | 4/2009 |

OTHER PUBLICATIONS

International Search Report dated Feb. 26, 2013 from related International Application No. PCT/US2012/050267.

* cited by examiner

*Primary Examiner* — Cynthia Hamilton
(74) *Attorney, Agent, or Firm* — Scully, Scott, Murphy & Presser, P.C.; Margaret A. McNamara, Esq.

(57) ABSTRACT

A negative developable bottom antireflective coating (NDBARC) material includes a polymer containing an aliphatic alcohol moiety, an aromatic moiety, and a carboxylic acid moiety. The NDBARC composition is insoluble in a typical resist solvent such as propylene glycol methyl ether acetate (PGMEA) after coating and baking. The NDBARC material also includes a photoacid generator, and optionally a crosslinking compound. In the NDBARC material, the carboxylic acid provides the developer solubility, while the alcohol alone, the carboxylic acid alone, or their combination provides the PGMEA resistance. The NDBARC material has resistance to the resist solvent, and thus, intermixing does not occur between NDBARC and resist during resist coating over NDBARC. After exposure and bake, the lithographically exposed portions of both the negative photoresist and the NDBARC layer become insoluble in developer due to the chemically amplified crosslinking of the polymers in negative resist and NDBARC layer in the lithographically exposed portions.

22 Claims, 2 Drawing Sheets

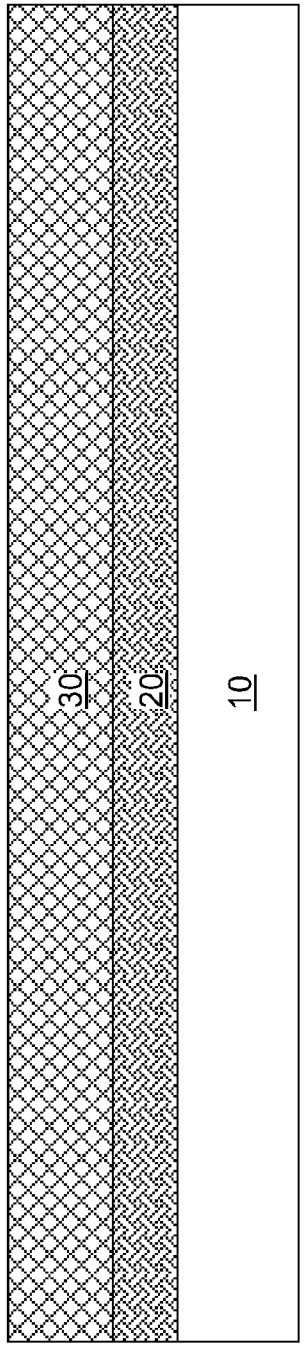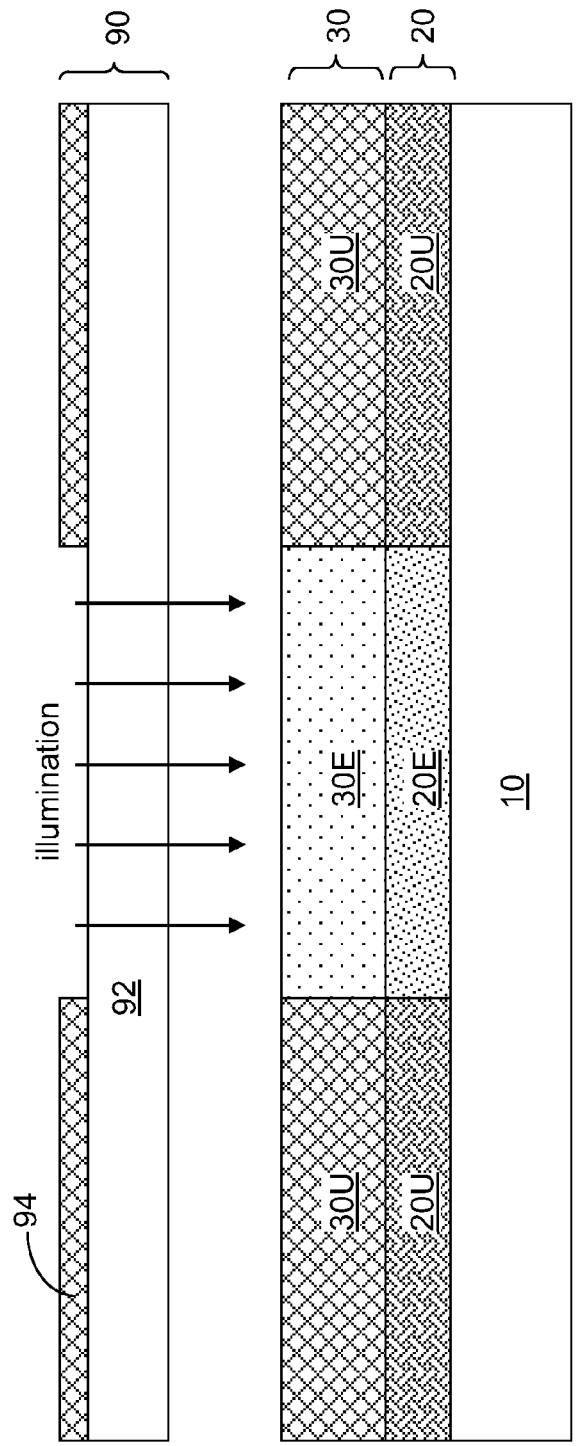

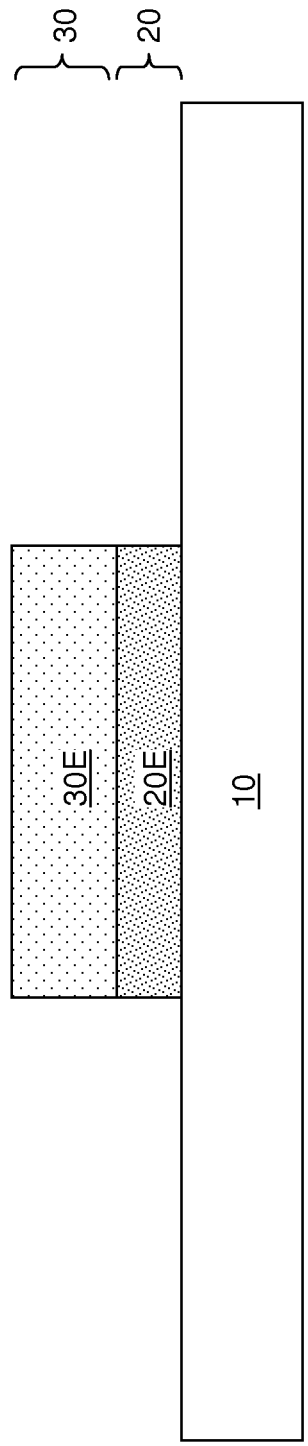
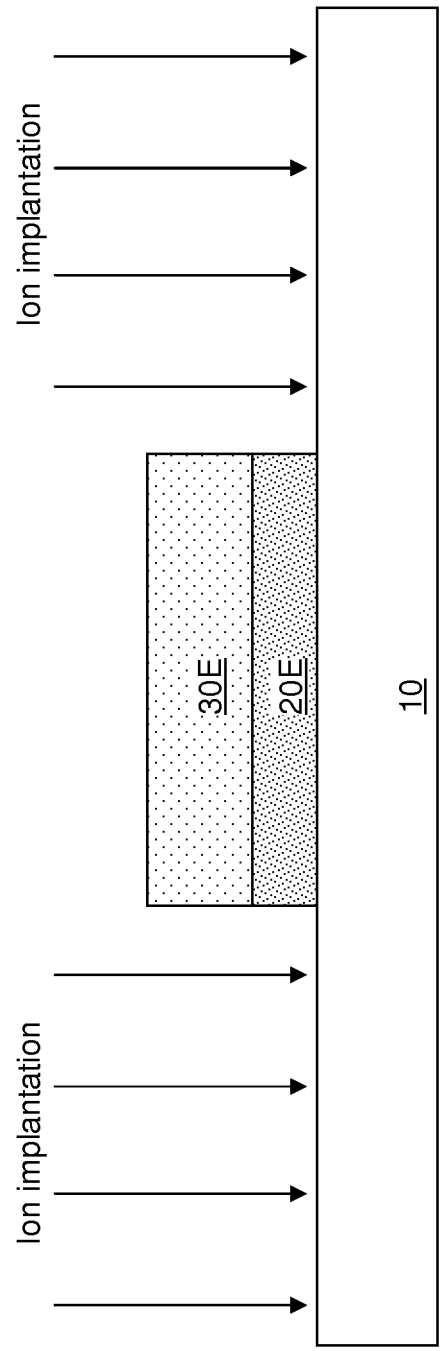

DEVELOPABLE BOTTOM ANTIREFLECTIVE COATING COMPOSITIONS FOR NEGATIVE RESISTS

BACKGROUND

The present disclosure relates to chemical compositions, and particularly to compositions for developable bottom antireflective coating (DBARC) material, structures, methods of making and using the same.

High reflectivity from the substrate has become increasingly detrimental to the lithographic performance of photoresists for high numerical aperture (NA) and short ultraviolet (UV) wavelength (such as 248 nm, 193 nm, and shorter wavelengths) exposures. The problem of the negative impact of high reflectivity on lithographic performance is more pronounced in implant levels owing to the existence of surface topography generated after gate patterning and/or use of various reflective substrates (such as substrates including silicon, silicon nitride and silicon oxide) for advanced semiconductor devices.

Use of a top antireflective coatings (TARC) layer to improve lithographic images is known in the art. The reflectivity control provided by a TARC layer is in general not as good as reflectivity control provided using a bottom antireflective coating (BARC) layer. Using a BARC layer, however, requires an etch step for removing the BARC layer. This etch process could damage the underlying substrate, and thus, use of a BARC layer is not desirable for many applications including implant levels.

Two types of photoresists are known in the art. A positive photoresist is a type of photoresist in which the portion of the photoresist exposed to light becomes soluble to the photoresist developer. The portion of the photoresist that is unexposed remains insoluble to the photoresist developer. A negative resist is a type of photoresist in which the portion of the photoresist exposed to light becomes insoluble to the photoresist developer. The unexposed portion of the photoresist is dissolved by the photoresist developer.

A DBARC layer has been proposed to alleviate the reflectivity control issues for positive photoresists. DBARC materials known in the art include materials that are compatible only with positive photoresists. DBARC systems for positive resists are disclosed, for example, in U.S. Pat. No. 6,844,131 to Oberlander et al. and U.S. Patent Application Publication Nos. 20070243484 to Chen et al. and 20100196825 to Huang et al. The DBARC material for positive photoresists becomes soluble to photoresist developer upon irradiation with light in the same manner as the positive photoresists.

However, many implant levels in semiconductor manufacturing employ negative photoresists because negative photoresists provide superior clearing of resist images over topography, and less resist shrinkage during ion implantation compared with positive photoresists. Therefore, there is a need for a DBARC system suitable for use with a negative photoresist.

BRIEF SUMMARY

A negative developable bottom antireflective coating (ND-BARC) material includes a polymer containing an aliphatic alcohol moiety, an aromatic moiety, and a carboxylic acid moiety. The NDBARC composition is insoluble in a typical resist solvent such as propylene glycol methyl ether acetate (PGMEA) after coating and baking The NDBARC material also includes a photoacid generator. The NDBARC material may also include a crosslinking compound.

In the NDBARC material, the carboxylic acid provides the developer solubility, while alcohol and/or carboxylic acid provides the PGMEA resistance. The NDBARC material has resistance to the resist solvent, and thus, intermixing does not occur between NDBARC and resist during resist coating over NDBARC. After exposure and bake of a stack of a NDBARC layer and a negative photoresist, the lithographic exposed portions of both the negative photoresist and the NDBARC layer become insoluble in developer due to the chemically amplified crosslinking of the negative resist and NDBARC in the lithographically exposed portions.

According to an aspect of the present disclosure, a composition of matter for a NDBARC material is provided. The composition of matter includes a polymer including at least one carboxylic acid moiety, at least one cross-linkable aliphatic alcohol moiety, and at least one aromatic moiety.

According to another aspect of the present disclosure, a method of forming a lithographic structure is provided. The method includes: forming a stack, from bottom to top, of a NDBARC layer and a negative photoresist layer on a surface of a substrate, wherein the NDBARC layer includes a polymer including at least one carboxylic acid moiety, at least one cross-linkable aliphatic alcohol moiety, and at least one aromatic moiety; lithographically exposing a portion of the stack; and developing the stack, wherein lithographically unexposed portions of the stack are removed from above the surface of the substrate during development.

According to yet another aspect of the present disclosure, a structure includes a stack, from bottom to top, of a NDBARC layer and a negative photoresist layer. The stack is located on a surface of a substrate. The NDBARC layer includes a polymer including at least one carboxylic acid moiety, at least one cross-linkable aliphatic alcohol moiety, and at least one aromatic moiety.

BRIEF DESCRIPTION OF THE SEVERAL VIEWS OF THE DRAWINGS

FIG. 1 is a vertical cross-sectional view of an exemplary structure employing a NDBARC layer after formation of a stack of the NDBARC layer and a negative photoresist layer according to an embodiment of the present disclosure.

FIG. 2 is a vertical cross-sectional view of the exemplary structure after lithographic exposure of the stack of the NDBARC layer and the negative photoresist layer according to an embodiment of the present disclosure.

FIG. 3 is a vertical cross-sectional view of the exemplary structure after developing the stack of the NDBARC layer and the negative photoresist layer according to an embodiment of the present disclosure.

FIG. 4 is a vertical cross-sectional view of the exemplary structure during ion implantation employing the stack of the NDBARC layer and the negative photoresist layer as a masking layer according to an embodiment of the present disclosure.

DETAILED DESCRIPTION

As stated above, the present disclosure relates to compositions for NDBARC material, structures, methods of making and using the same, which are now described in detail with accompanying figures. Throughout the drawings, the same reference numerals or letters are used to designate like or equivalent elements. The drawings are not necessarily drawn to scale.

An NDBARC material according to an embodiment of the present disclosure includes a polymer containing carboxylic acid moieties, cross-linkable aliphatic alcohol moieties, and aromatic moieties. Example of a carboxylic moiety is a repeat unit in a polymer containing carboxylic acid group. A repeat unit herein refers to a unit that is repeated in a chain. Similarly, a repeat unit containing aliphatic alcohol group or aromatic group is an aliphatic moiety or an aromatic moiety, respectively. A repeat unit may also contain more than one of these carboxylic acid, aliphatic alcohol and aromatic groups in various combinations. The chemical formula for an exemplary polymer 100, which includes m repeat units of a carboxylic acid moiety 110, n repeat units of a crosslinkable aliphatic alcohol moiety 120, and l repeat units of an aromatic moiety 130 is shown below:

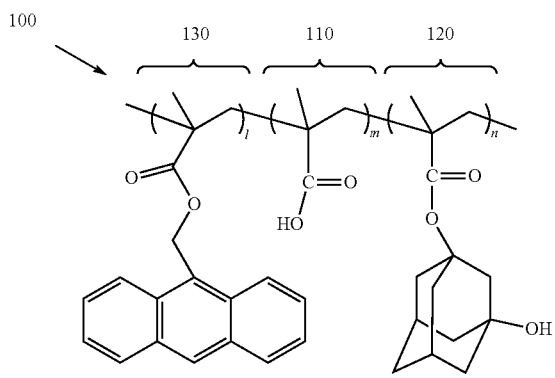

In the exemplary polymer 100 above, subscripts l, m and n are the number of repetitions of each repeat unit. Each of the numbers l, m, and n can be an integer greater than 1, and can be in the range from 2 to 1,000, and typically from 10 to 200, although lesser and greater numbers can also be employed. The molar percentage of the m repeat units of the carboxylic acid moiety 110 is $m/(m+n+l+k)$, the molar percentage of the n repeat units of the crosslinkable aliphatic alcohol moiety 120 is $n/(m+n+l+k)$, and the molar percentage of the l repeat units of the aromatic moiety 130 is $l/(m+n+l+k)$. Here, k is the total number of other optional moieties that may, or may not, be attached to the chain. In one embodiment, the number k can be 0. In another embodiment, the number k can be a positive integer that is in the range from 0.5% to 50% of the sum of m, n, and l.

The m repeat units of the carboxylic acid moiety 110 can be replaced with a plurality of first repeat unit groups. Each first repeat group may include a carboxylic acid moiety that is repeated at least twice and is different from any other first repeat unit group linked directly to that first repeat unit group. The n repeat units of the crosslinkable aliphatic alcohol moiety 120 can be replaced with a plurality of second repeat unit groups. Each second repeat group may include a crosslinkable aliphatic alcohol moiety that is repeated at least twice and is different from any other second repeat unit group linked directly to that second repeat unit group. The l repeat units of the aromatic moiety 130 can be replaced with a plurality of third repeat unit groups. Each third repeat group may include an aromatic moiety that is repeated at least twice and is different from any other third repeat unit group linked directly to that third repeat unit group. Further, each first repeat group, each second repeat group, and/or each third repeat group may be directly linked to any of the first repeat groups, the second repeat groups, and/or the third repeat groups. Thus, the exemplary polymer 100 can include multiple units of at least one carboxylic acid moiety, multiple units of at least one crosslinkable aliphatic alcohol moiety, and multiple units of at least one aromatic moiety.

The NDBARC material is insoluble in a typical resist solvent such as propylene glycol methyl ether acetate (PGMEA) after coating and baking. The NDBARC material also includes a photoacid generator. The NDBARC may also include a crosslinking compound.

In the NDBARC material, the carboxylic acid provides the developer solubility, while the carboxylic acid alone, the alcohol alone, or the combination of alcohol and carboxylic acid provides resistance to the resist solvent, which can be PGMEA. The NDBARC material has resistance to the resist solvent, and thus, intermixing does not occur between NDBARC and resist during resist coating over NDBARC. After exposure and bake of a stack of a NDBARC layer and a negative photoresist, the lithographic exposed portions of both the negative photoresist and the NDBARC layer become insoluble in developer due to the chemically amplified crosslinking of polymers in the negative resist and the polymers 100 in the NDBARC material in the lithographically exposed portions. As such, the NDBARC layer includes a NDBARC material that becomes insoluble to a developer solution after lithographic exposure.

The lithographically exposed stack of the NDBARC layer and the negative photoresist is subjected to development. The lithographically unexposed, i.e., unilluminated, portions of the stack of the NDBARC layer and the negative photoresist are cleaned, i.e., removed, during the development. A clean negative image including the lithographically exposed portions of the NDBARC layer and the negative photoresist is formed over an underlying substrate.

The choice of aromatic moieties for the NDBRAC layer depends on the exposure wavelength. For use in 193 nm lithography, most of the aromatic groups known in the art can be employed. Preferred aromatic groups for 193 nm lithography include phenyl and phenol groups and their derivatives.

For use in 248 nm lithography, fused aromatic systems are necessary to provide sufficient absorption coefficient k for the NDBARC material. Typical target values for the absorption coefficient k can be from 0.1 to 0.9 at the wavelength of irradiation, although lesser and greater values can also be employed. The preferred aromatic groups for 248 nm lithography include anthracene, naphthalene, and their derivatives. To balance the solubility in developer and resistance to the resist solvent, alcohol containing polycyclic structures can be employed.

Each of the carboxylic acid moieties 110 is a moiety containing carboxylic acid group in which a carbon (C) atom is bonded to an oxygen (O) atom by a double bond and to a hydroxyl group (—OH) by a single bond. A fourth bond links the carbon atom to some other univalent combining group. Thus, the carboxylic acid group has the following structure:

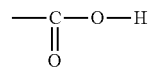

The chemical characteristic of the carboxylic acids includes acidity. Carboxylic acids are generally more acidic than other organic compounds containing hydroxyl groups but are generally weaker than the mineral acids such as hydrochloric acid and sulfuric acid. Carboxylic acids include, but are not limited to, formic acid, acetic acid, palmitic acid, stearic acid, acrylic acid, methacrylic acid (MAA), and oleic acid. Correspondingly, the at least one carboxylic acid moiety includes at least one of a formic acid moiety, an acetic acid moiety, a palmitic acid moiety, a stearic acid moiety, an oleic acid moiety, an acrylic acid moiety, a MAA moiety, a 4-vinylbenzoic acid moiety, a 2-carboxyethyl acrylate moiety, a mono-2-(methacryloyloxy)ethyl succinate moiety. Chemical formulas for non-limiting examples of the monomers for the carboxylic acid moieties include:

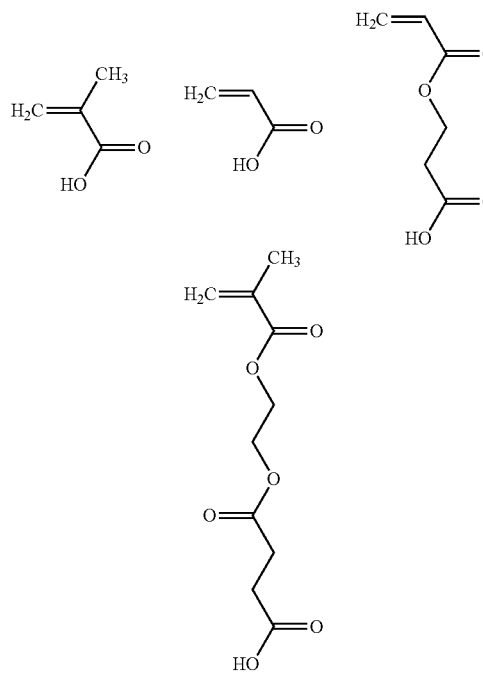

Each of the cross-linkable aliphatic alcohol moieties 120 includes a series of homologous organic compounds containing one or more hydroxyl groups (—OH) attached to an alkyl group and are cross-linkable. The hydroxyl group may crosslink with carboxylic acid to form ester. The hydroxyl group may crosslink with another hydroxyl group to form ether. The hydroxyl group may also crosslink with reactive ether. The cross-linkable aliphatic alcohol moiety may also include at least one unsaturated link that can combine with another unsaturated link of another cross-linkable aliphatic alcohol moiety to provide a cross-linking between polymers 100 when sufficient energy is provided, for example, by absorption of radiation by a nearby chromophore. Non-limiting examples of the cross-linkable aliphatic alcohol include 3-Hydroxy-1-adamantylmethacrylate (HADMA), 2-hydroxyethylmethacrylate (HEMA), 3-(2'-hydroxyethoxy)-1-adamantylmethacrylate (HEADMA). Correspondingly, the at least one cross-linkable aliphatic alcohol moiety includes at least one of a HADMA moiety, a HEMA moiety, a HEADMA moiety. Besides cross-linkable aliphatic alcohol moiety, reactive ether is also cross-linkable. Other crosslinkable chemical formulas for non-limiting examples of the monomers for the cross-linkable aliphatic alcohol moiety and reactive ether moiety include:

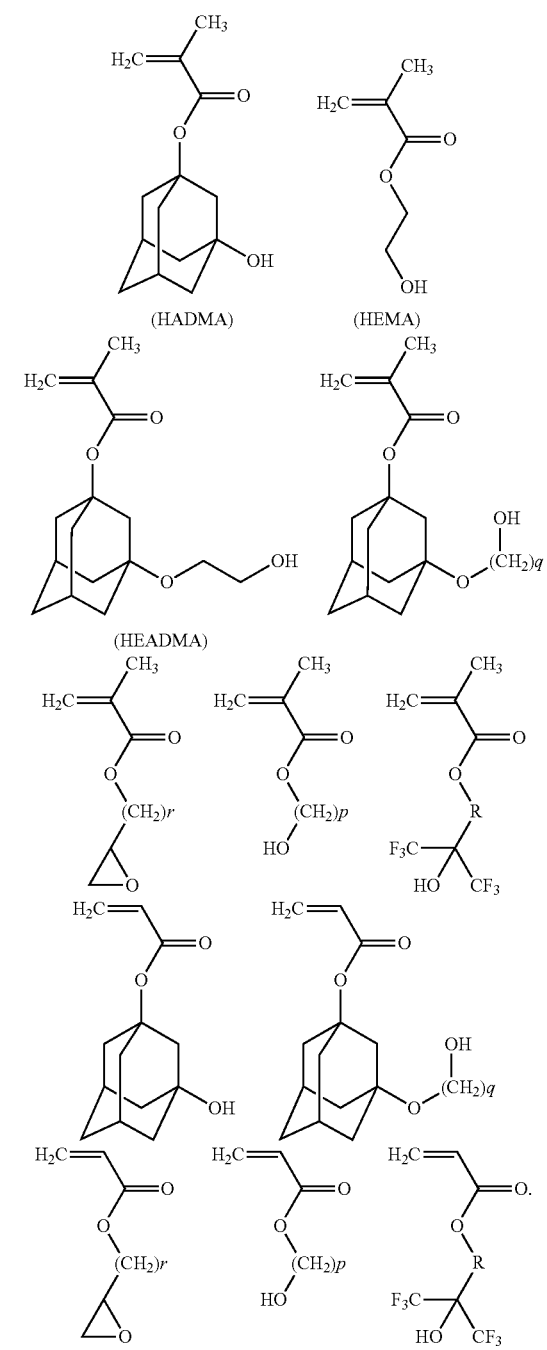

The symbols p, q, and r represent positive integers, each independently having a value from 1 to 30. The symbol R represents a saturated carbon chain including at least one carbon atom, in which the total number of carbon atom(s) is from 1 to 30.

Each of the aromatic moieties 130 includes a chromophore. The chromophore absorbs certain wavelengths of UV light and transmits or reflects others. The chromophore can be selected to absorb the same wavelength of radiation as the illumination to be employed to lithographically expose a negative photoresist layer upon the NDBARC material. Thus, the at least one aromatic moiety can include at least one chromophore moiety that absorbs light at a wavelength selected from a wavelength range from 100 nm and 400 nm. As an illustrative example, if the negative photoresist layer is sensitive to 248 nm radiation, the chromophore is selected to absorb 248 nm radiation. If the negative photoresist layer is sensitive to 193 nm radiation, the chromophore is selected to absorb 193 nm radiation. Non-limiting examples of the chromophore that can be employed for the aromatic moiety in the NDBARC material include repeat unit from monomer of 9-anthrylmethylmethacrylate (ANTMA) vinyl naphthalene for 248 nm applications and 4-hydroxystyrene and styrene for 193 nm applications. Correspondingly, the at least one aromatic moiety includes at least one of an ANTMA moiety, a 4-hydroxystyrene moiety, a styrene moiety. Chemical formulas for non-limiting examples of the monomers for the chromophore aromatic moiety include:

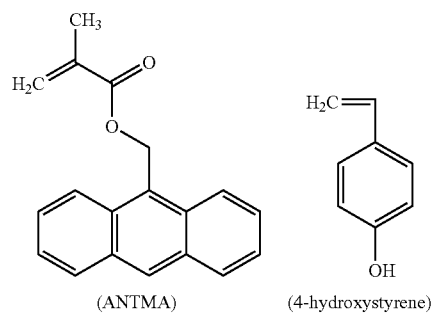

(ANTMA)   (4-hydroxystyrene)   (Styrene)

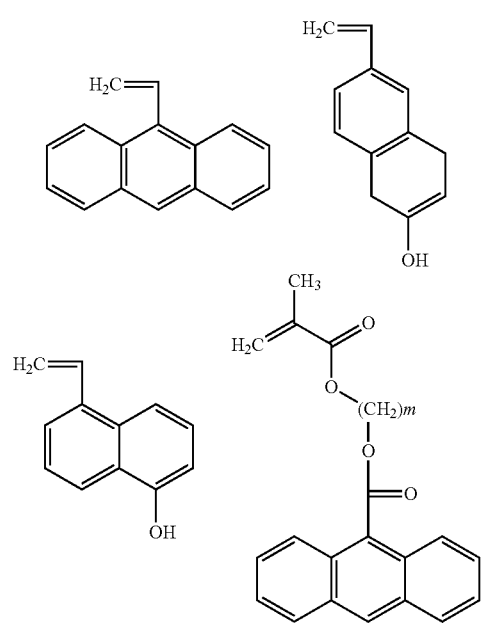

-continued

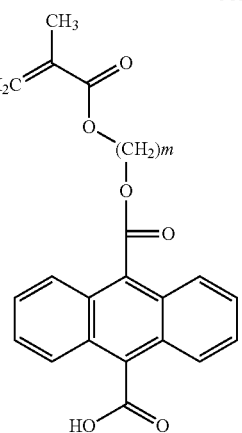 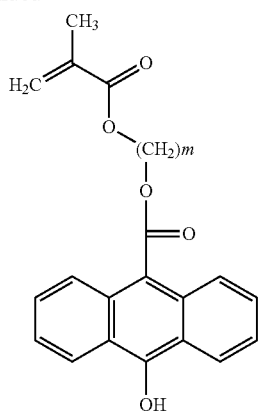

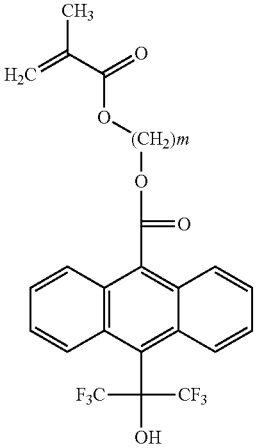 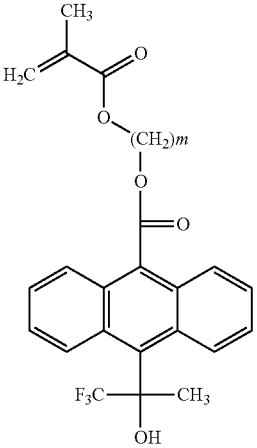

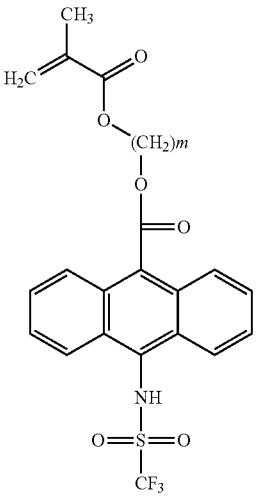 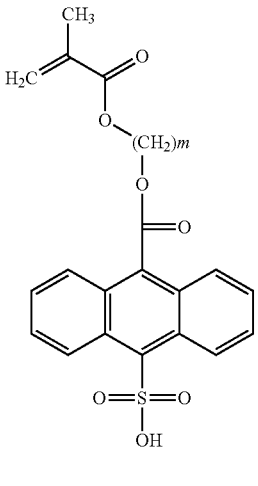

-continued
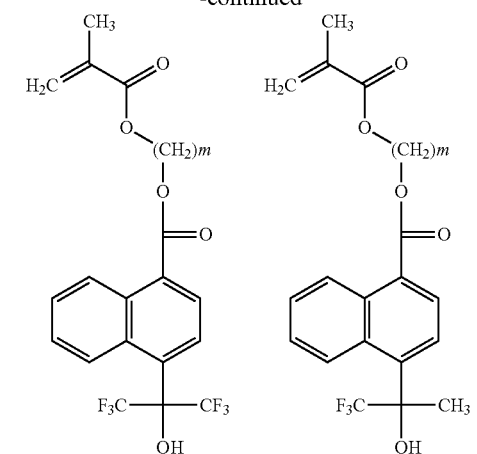
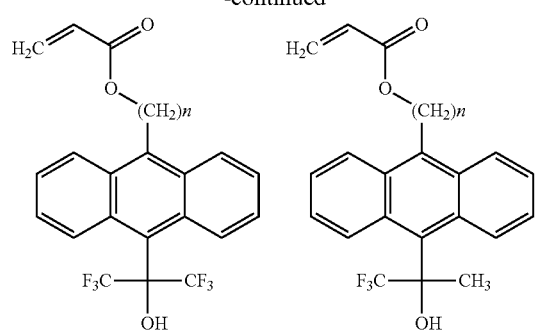
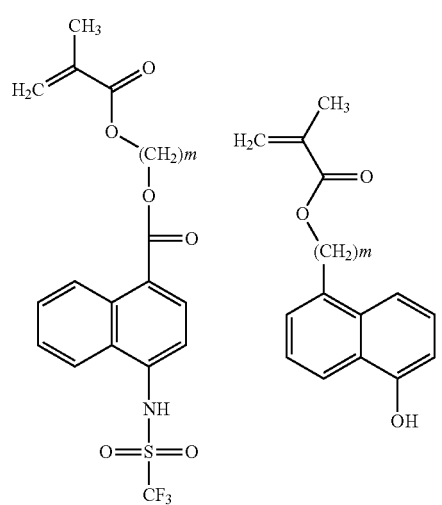
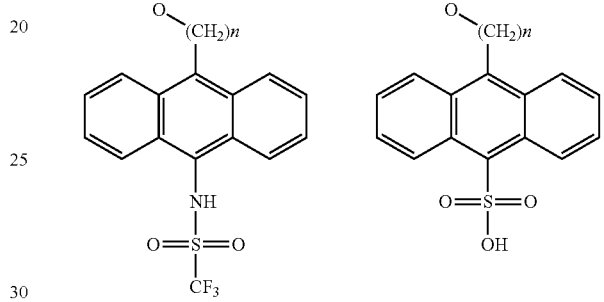
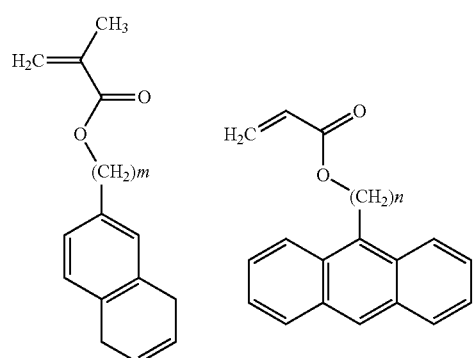
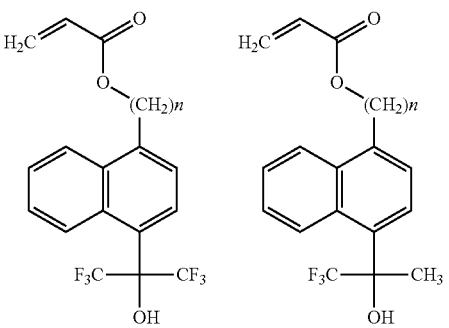
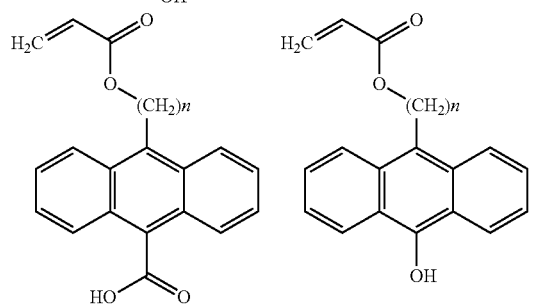
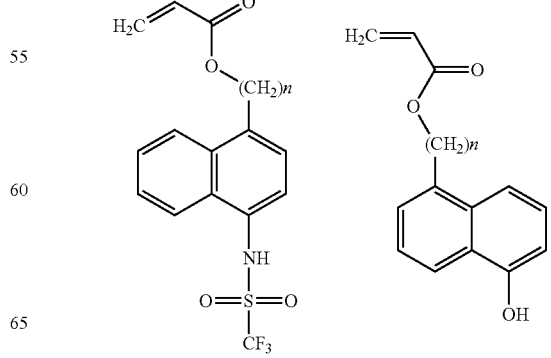

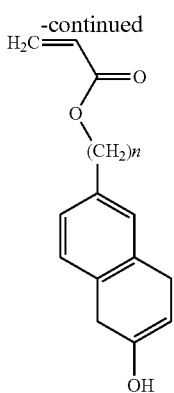

The symbol n represent positive integers in a range from 0 to 30 and m represent positive integers in a range from 1 to 30.

The polymer 100 may optionally include other moieties such as solubility promoter moiety, which promotes the solubility of the polymer 100 in a solvent. For example, repeat unit from monomer of 5-methacroyloxy-2,6-norbornane carbolactone (NLM) may be added to the polymer 100. The chemical formula for NLM and other monomers for solubility promoting moieties include:

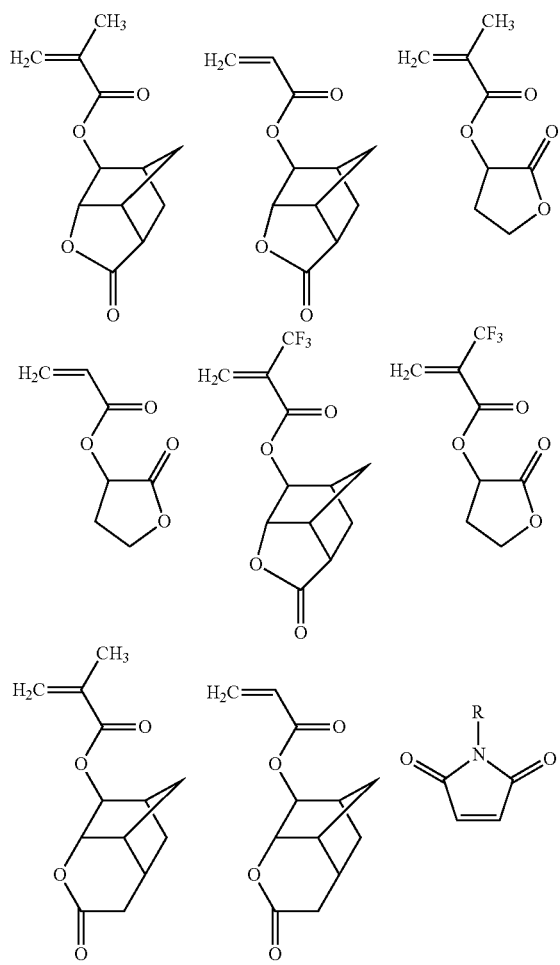

Wherein R is a hydrogen atom or an alkyl group having 1 to 10 carbon atoms.

The polymer 100 can be formed, for example, by polymerizing at least one first monomer including a carboxylic acid moiety 110, at least one second monomer including a cross-linkable aliphatic alcohol moiety 120, and at least one third monomer including an aromatic moiety 130. The polymerization can be performed, for example, employing a solvent that dissolves the first, second, and third monomers. Each of the at least one first monomer, the at least one second monomer, and the at least one third monomer can include a single species of monomer or a plurality of monomers. The polymer 100 may be made by conventional polymerization techniques, e.g. radical, cation, anion, or organometallic catalyzed polymerization.

In one embodiment, the molar percentage of the at least one first monomer unit within the polymer of the first, second, and third monomer units can be from 20 to 70. In another embodiment, the molar percentage of the at least one first monomer unit within the polymer of the first, second, and third monomer units can be from 30 to 60.

In one embodiment, the molar percentage of the at least one second monomer unit within the polymer of the first, second, and third monomer units can be from 10 to 70. In another embodiment, the molar percentage of the at least one second monomer unit within the polymer of the first, second, and third monomers can be from 20 to 60.

In one embodiment, the molar percentage of the at least one third monomer unit within the polymer of the first, second, and third monomer unit can be from 10 to 70. In another embodiment, the molar percentage of the at least one third monomer unit within the polymer of the first, second, and third monomer units can be from 20 to 50.

In one embodiment, a molar percentage of the at least one carboxylic acid moiety relative to a total mole of the at least one carboxylic acid moiety, the at least one cross-linkable aliphatic alcohol moiety, and the at least one aromatic moiety is from 20 to 70, and a molar percentage of the at least one cross-linkable aliphatic alcohol moiety relative to the total mole of the at least one carboxylic acid moiety, the at least one cross-linkable aliphatic alcohol moiety, and the at least one aromatic moiety is from 10 to 70. The sum of all mole percentages of the first, second, and third chemical compounds is 100 in the polymer. The polymer is included in the NDBARC composition.

The polymer of the invention preferably have a weight average molecular weight of at least about 1000, more preferably a weight average molecular weight of about 1,500-50,000. If desired, mixtures of different polymers of the invention may be used or the polymer may contain other polymer components. In general, however, the NDBARC compositions of the invention preferably consist essentially of the polymers of the invention.

For NDBARC composition to be able to coat on a substrate with spin coating technique, the composition has to be in a solution. In one embodiment, the NDBARC material includes a casting solvent in which the polymer is dissolved.

Non limiting examples of the casting solvent include propylene glycol methyl ether (PGME), gamma-butyrolactone (GBL), anisol, propylene carbonate, sulfolane, dimethyl succinate, dimethyl adipate, ethyl lactate, 4-methyl-2-pentanol and other alcohol based solvents. Mixed solvents may also be used in this invention. Examples of mixed solvents may include PGME and GBL, with the wt. % (weight percentage) of one solvent in the total weight of the solvent mixture is from 1 to 99. In one embodiment, the wt. % of any of the solvents in the total weight of the solvent mixture is in the range of 25 to 80. The amount of solvent in the composition for application to substrate is preferably sufficient to achieve a solid content of about 0.5-7 wt. %. In addition, the NDBARC material also include at least one photoacid generator. It may also include at least one crosslinking compound. The photoacid generator and the crosslinking compound are dissolved in the solvent.

The photoacid generator can be any type of photoacid generator known in the art. The photoacid generator provides the capability of acid catalyzed chemical amplification for the photoresist and NDBARC by releasing an acid upon irradiation. During chemical amplification, photoacid released by the exposure radiation catalyzes crosslinking reaction of the polymer in NDBARC during the post-exposure bake step. The photoacid renders polymer 100 insoluble in developer. A single photoacid molecule can catalyze many such reactions.

Application of the present disclosure is not limited to the use of any specific acid generator or combination of acid generators, that is the benefits of the invention may be achieved using various acid generators known in the art. Examples of suitable radiation-sensitive acid generators include (but preferably with alkyl substituted for one or more of any indicated aryl moieties) onium salts such as triaryl sulfonium hexafluoroantimonate, diaryliodonium hexafluoroantimonate, hexafluoroarsenates, triflates, perfluoroalkane sulfonates (e.g., perfluoromethane sulfonate, perfluorobutane sulfonate, perfluorohexane sulfonate, perfluorooctane sulfonate etc.), substituted aryl sulfonates such as pyrogallols (e.g. trimesylate of pyrogallol or tris(sulfonate) of pyrogallol), sulfonate esters of hydroxyimides, N-sulfonyloxynaphthalimides (N-camphorsulfonyloxynaphthalimide, N-pentafluorobenzenesulfonyloxynaphthalimide), α,α'bissulfonyl diazomethanes, naphthoquinone-4-diazides, alkyl disulfones and others. The radiation-sensitive acid generator should be compatible with the other components of the resist composition. If desired, combinations of radiation-sensitive acid generators may be used.

The crosslinking compound can be any type of crosslinking compound known in the art. The cross-linking compound induces molecules of the polymers 100 to be crosslinked with one another. The crosslinking compound of the NDBARC compositions of the invention is preferably a crosslinker that can be reacted with the polymer in a manner which is catalyzed by generated acid and/or by heating. Generally, the crosslinking compound may be any suitable crosslinking agent which is otherwise compatible with the other components of the composition. The crosslinking agents preferably act to crosslink the polymeric component in the presence of a generated acid. Suitable organic crosslinking agents include, but are not limited to: amine-containing compounds, epoxy-containing compounds, compounds containing at least two vinyl ether groups, allyl substituted aromatic compounds, compounds containing at least two or more diazonaphthoquinone sulfonic acid ester groups and combinations thereof. Preferred crosslinking agents are glycoluril compounds such as tetramethoxymethyl glycoluril, methyl-propyltetramethoxymethyl glycoluril, and methylphenyltetramethoxymethyl glycoluril, available under the POWDER-LINK trademark from Cytec Industries, Inc. Other preferred crosslinking agents include 2,6-bis(hydroxymethyl)-p-cresol and compounds having the following structures:

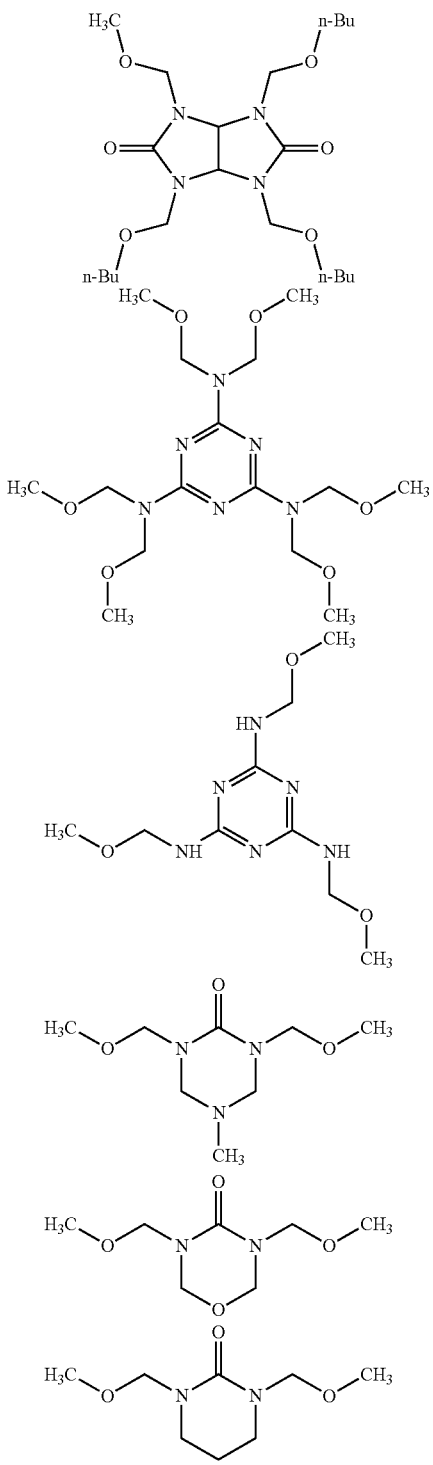

including their analogs and derivatives, such as those found in Japanese Laid-Open Patent Application (Kokai) No. 1-293339, as well as etherified amino resins, for example methylated or butylated melamine resins (N-methoxymethyl- or N-butoxymethyl-melamine respectively) or methylated/butylated glycolurils, for example as can be found in Canadian Patent No. 1,204,547. Other crosslinking agents such as bis-epoxies or bis-phenols (e.g., bisphenol-A) may also be used. Combinations of crosslinking agents may be used.

The NDBARC compositions of the invention may further contain minor amounts of auxiliary components such as dyes/sensitizers, base additives, etc. as are known in the art. Preferred base additives are bases which scavenge trace acids while not having an excessive impact on the performance of the NDBRAC. Common base additives are aromatic amines, aliphatic amines, or tetraalkyl ammonium hydroxides such as tetrabutyl ammonium hydroxide (TBAH).

The NDBARC compositions of the invention preferably contain about 0.5-20 wt. % (more preferably about 3-15 wt. %) acid generator based on the total weight of the polymeric component in the composition. Where a solvent is present, the overall composition preferably contains about 50-99.5 wt. % solvent. In one embodiment, the NDBARC compositions of the invention may also contain about 1-30 wt. % (preferably, about 3-15 wt. %) of crosslinking component based on the total weight of the polymeric component in the composition. The compositions may also contain preferably about 3 wt. % or less of said base additive based on the total weight of polymeric component.

In an illustrative example, an exemplary NDBARC material can be formed by providing the following exemplary composition:
a terpolymer containing 45 molar percentage of MAA;
30 molar percentage of HADMA;
25 molar percentage of ANTMA;
5 parts in weight of bis(4-ter-butylphenyl)iodonium nonafluorobutane-1-sulfonate (BPIN) and
0.425 part in weight of ter-butyl 2-phenyl-1,3-benzodiazole-1-carboxylate quencher (BB) (all relative to polymer).

The above mixture can be dissolved in a solvent including a 50%-50% mixture in weight of PGME and GBL.

Referring to FIG. 1, the NDBARC material including the polymer 100 can be employed in a lithographic system in combination with a negative photoresist. Specifically, a stack including, from bottom to top, a NDBARC layer 20 and a negative photoresist layer 30 is formed on a surface of a substrate 10. The NDBARC layer 20 is formed by coating a solution including the polymer described above and a solvent in which the polymer is dissolved onto the substrate 10. The stack of the NDBARC layer 20 and the negative photoresist layer 30 can be formed, for example, by sequential spin coating processes on a substrate 10, which can be a semiconductor substrate including a semiconductor material layer. The NDBARC layer 20 includes the polymer, which includes at least one carboxylic acid moiety, at least one cross-linkable aliphatic alcohol moiety, and at least one aromatic moiety as described above.

For example, the exemplary NDBARC material described above can be applied on a substrate 10 having a diameter of 300 mm at a thickness of about 60 nm by a spin coating in which the substrate 10 is rotated at 1,270 revolutions per minute (rpm) to form a NDBARC layer 20. In general, the thickness of the NDBARC layer 20 can be from 10 nm to 150 nm, although lesser and greater thicknesses can also be employed. For example, the NDBARC layer 20 can be baked at a temperature from 80° C. to 130° C. for a duration from 30 seconds to 180 seconds to perform a post-apply bake process thereupon. In an illustrative example, a NDBARC layer 20 including the exemplary composition described above was baked at 110° C. for 60 seconds to perform a post-apply bake process.

The negative photoresist layer 30 includes a negative photoresist material such as NSD2803Y, which is commercially available from JSR Corporation. The negative photoresist material can be applied on the surface of the NDBARC layer 20 at a thickness of about 270 nm by a spin coating in which the substrate 10 is rotated at 1,200 rpm to form the negative photoresist layer 30. In general, the thickness of the negative photoresist layer 30 can be from 30 nm to 900 nm, although lesser and greater thicknesses can also be employed. The negative photoresist layer 30 can be baked at a temperature from 60° C. to 100° C. for a duration from 30 seconds to 180 seconds to perform a post-apply bake process thereupon. In an illustrative example, a negative photoresist layer 30 including NSD2803Y was baked at 80° C. for 60 seconds to perform a post-apply bake process.

Referring to FIG. 2, a portion of the stack is lithographically exposed. Lithographic exposure can be performed employing any lithographic exposure tool known in the art. A reticle 90 including a transparent substrate 92 and a patterned opaque film 94 can be employed for lithographic exposure. For example, a 248 nm lithography tool having a NA of 0.8 and σ of 0.6 can be employed to provide conventional illumination at a dose of about 30 mJ/cm$^2$ and a depth of focus of about −0.05 μm from the top surface of the negative photoresist layer 30. The lithographically exposed portion of the negative photoresist layer 30 is herein referred to as a lithographically exposed negative photoresist portion 30E. The unexposed portion of the negative photoresist layer 30 is herein referred to as an unexposed negative photoresist portion 30U. The lithographically exposed portion of the NDBARC layer 20 is herein referred to as a lithographically exposed NDBARC portion 20E. The unexposed portion of the NDBARC layer 20 is herein referred to as an unexposed NDBARC portion 20U. The NDBARC layer 20 and the negative photoresist layer 30 can be baked at a temperature from 90° C. to 130° C. for a duration from 30 seconds to 180 seconds to perform a post-exposure bake process thereupon. In an illustrative example, the NDBARC layer 20 including the exemplary composition described above was baked at 110° C. for 60 seconds to perform a post-exposure bake process.

Referring to FIG. 3, the negative photoresist layer 30 and the NDBARC layer 20 are developed. The unexposed portions of the stack are removed from above the surface of the substrate 10 during development. Specifically, the unexposed negative photoresist portion 30U and the unexposed NDBARC portion 20U are removed during lithographic development, and the lithographically exposed negative photoresist portion 30E and the exposed NDBARC portion 20E remain on the substrate 10. The NDBARC layer 20 and the negative photoresist layer 30 have a same pattern including at least one opening therein, and at least one portion of the surface of the substrate 10 is physically exposed to an ambient gas, which can be air or an inert gas.

Referring to FIG. 4, a processing step employing the stack of the patterned negative photoresist layer and the patterned NDBARC layer, i.e., the remain stack of the lithographically exposed negative photoresist portion 30E and the lithographically exposed NDBARC portion 20E, is performed. The processing step can be ion implantation, a wet etch, a dry etch, or any other processing step that employs the stack of the patterned negative photoresist layer and the patterned NDBARC layer as a masking layer.

The following examples are provided to illustrate the inventive NDBARC compositions and some advantages in using the same.

EXAMPLE 1

Synthesis of MAA/HADMA/ANTMA (P1)

To a mixture of methacrylic acid (0.775 g, 9 mmol), 3-hydroxy-1 adamantylmethacrylate (1.42 g, 6 mmol), 9-anthrylmethylmethacrylate (1.38 g, 5 mmol) in 20 mL of tetrahydrofuran (THF) was added 2,2'-azobis(2-methylpropionitrile (0.16 g, 1 mmol). The resulting solution was purged by nitrogen for 30 minutes before it was heats to 72° C. for 18 hours under nitrogen. The solution was then cooled to room temperature and added drop-wise into 400 mL of de-ionized water. The solid was filtered with a frit funnel, washed with water (2×200 ml) and dried in a vacuum oven at 50° C. for 24 hours to afford 3.1 gram of P1 as white solid.

EXAMPLE 2

Synthesis of MAA/HEMA/ANTMA (P2)

To a mixture of methacrylic acid (0.775 g, 9 mmol), 2-hydroxyethylmethacrylate (0.78 g, 6 mmol), 9-anthrylmethylmethacrylate (1.38 g, 5 mmol) in 20 mL of THF was added 2,2'-azobis(2-methylpropionitrile (0.16 g, 1 mmol). The resulting solution was purged by nitrogen for 30 minutes before it was heats to 72° C. for 18 hours under nitrogen. The solution was then cooled to room temperature and added drop-wise into 400 mL of de-ionized water. The solid was filtered with a frit funnel, washed with water (2×200 ml) and dried in a vacuum oven at 50° C. for 24 hours to afford 2.5 gram of P2 as white solid.

EXAMPLE 3

Synthesis of MAA/HEADMA/ANTMA (P3)

To a mixture of methacrylic acid (0.775 g, 9 mmol), 3-(2'-hydroxyethoxy)-1-adamantylmethacrylate (1.68 g, 6 mmol), 9-anthrylmethylmethacrylate (1.38 g, 5 mmol) in 20 mL of THF was added 2,2'-azobis(2-methylpropionitrile (0.16 g, 1 mmol). The resulting solution was purged by nitrogen for 30 minutes before it was heats to 72° C. for 18 hours under nitrogen. The solution was then cooled to room temperature and added drop-wise into 400 mL of de-ionized water. The solid was filtered with a frit funnel, washed with water (2×200 ml) and dried in a vacuum oven at 50° C. for 24 hours to afford 3.5 gram of P3 as white solid.

EXAMPLE 4

Synthesis of MAA/GMA/ANTMA (P4)

To a mixture of methacrylic acid (0.775 g, 9 mmol), glycidyl methacrylate (0.85 g, 6 mmol), 9-anthrylmethylmethacrylate (1.38 g, 5 mmol) in 20 mL of THF was added 2,2'-azobis(2-methylpropionitrile (0.16 g, 1 mmol). The resulting solution was purged by nitrogen for 30 minutes before it was heats to 72° C. for 18 hours under nitrogen. The solution was then cooled to room temperature and added drop-wise into 400 mL of de-ionized water. The solid was filtered with a frit funnel, washed with water (two rinses of 200 ml of water per wash) and dried in a vacuum oven at 50° C. for 24 hours to afford 2.4 gram of P4 as white solid.

EXAMPLE 5

NDBARC Formulation (N1) for Lithographic Evaluation

A terpolymer (P1) consisting of 45 mole % (molar percentage) MAA, 30 mole % HADMA and 25 mole % ANTMA was dissolved in 50/50 wt. % PGME/GBL co-solvent with 5 wt. % BPIN and 0.425 wt. % of BB (all relative to polymer) to make a NDBARC solution with 2 wt. % of solid content. The resulting NDBARC solution was filtered through a 0.2 μm filter. The NDBARC solution was spin coated at 1186 rpm on a 12-inch silicon wafer which was treated with hexamethyldisilazane (HMDS) at 120° C. for 45 sec. The NDBARC was post-applying baked at 120° C. for 60 seconds to form a 60 nm thick film. A JSR negative resist NSD2803Y was then spin coated on the above mentioned wafer. The negative resist was post-applying baked at 80° C. for 60 seconds and exposed to 248 nm wavelength light on an ASML stepper (0.8NA, 0.6σ, partial coherence illuminations) with a binary reticle. The wafer was then post-exposure baked at 110° C. for 60 seconds. It was developed using a double-puddle develop process with 30 seconds for each puddle by using 0.263 N tetramethylammonium hydroxide (TMAH) developer (Moses Lake's AD-10). Under these process conditions, the 140 nm line/space, 145 nm isolated space and 145 nm isolated line features were obtained.

EXAMPLE 6

NDBARC Formulation (N2) for Lithographic Evaluation

A terpolymer (P2) consisting of 45 mole % MAA, 30 mole % HEMA and 25 mole % ANTMA was dissolved in 50/50 wt. % PGME/GBL co-solvent with 5 wt. % BPIN and 0.53 wt. % of BB (all relative to polymer) to make a NDBARC solution with 2 wt. % of solid content. The resulting NDBARC solution was filtered through a 0.2 μm filter. The NDBARC solution was spin coated at 1127 rpm on a 12-inch silicon wafer which was treated with HMDS at 120° C. for 45 sec. The NDBARC was post-applying baked at 120° C. for 60 seconds to form a 60 nm thick film. A JSR negative resist SUN7630 was then spin coated on the above mentioned wafer. The negative resist was post-applying baked at 80° C. for 60 seconds and exposed to 248 nm wavelength light on an ASML stepper (0.8NA, 0.6σ, partial coherence illuminations) with a binary reticle. The wafer was then post-exposure baked at 110° C. for 60 seconds. It was developed using a double-puddle develop process with 30 seconds for each puddle by using 0.263 N TMAH developer (Moses Lake's AD-10). Under these process conditions, the 140 nm line/space, 145 nm isolated space and 145 nm isolated line features were obtained.

EXAMPLE 7

NDBARC Formulation (N3) for Lithographic Evaluation

A polymer blend consists of 30 wt. % terpolymer (P2) and 70 wt. % terpolymer (P3) where P2 consisting of 45 mole % MAA, 30 mole % HEMA and 25 mole % ANTMA and P3 consisting of 45 mole % MAA, 30 mole % HEADMA and 25 mole % ANTMA was dissolved in 50/50 wt. % PGME/GBL co-solvent with 5 wt. % BPIN and 0.53 wt. % of BB (all relative to polymer blend) to make a NDBARC solution with 2 wt. % of solid content. The resulting NDBARC solution was filtered through a 0.2 μm filter. The NDBARC solution was spin coated at 1100 rpm on a 12-inch silicon wafer which was treated with HMDS at 120° C. for 45 sec. The NDBARC was post-applying baked at 120° C. for 60 seconds to form a 60 nm thick film. A JSR negative resist SUN7630 was then spin coated on the above mentioned wafer. The negative resist was post-applying baked at 80° C. for 60 seconds and exposed to 248 nm wavelength light on an ASML stepper (0.8NA, 0.6σ, partial coherence illuminations) with a binary reticle. The wafer was then post-exposure baked at 110° C. for 60 seconds. It was developed using a double-puddle develop process with 30 seconds for each puddle by using 0.263 N TMAH developer (Moses Lake's AD-10). Under these process conditions, the 140 nm line/space, 145 nm isolated space and 145 nm isolated line features were obtained.

EXAMPLE 8

NDBARC Formulation (N4) for Lithographic Evaluation

A terpolymer (P4) consisting of 45 mole % MAA, 30 mole % GMA and 25 mole % ANTMA was dissolved in 50/50 wt. % PGME/GBL co-solvent with 5 wt. % BPIN and 0.425 wt. % of BB (all relative to polymer) to make a NDBARC solution with 2 wt. % of solid content. The resulting NDBARC solution was filtered through a 0.2 μm filter. The NDBARC solution was spin coated at 944 rpm on a 12-inch silicon wafer which was treated with HMDS at 120° C. for 45 sec. The NDBARC was post-applying baked at 120° C. for 60 seconds to form a 60 nm thick film. A JSR negative resist NSD2803Y was then spin coated on the above mentioned wafer. The negative resist was post-applying baked at 80° C. for 60 seconds and exposed to 248 nm wavelength light on an ASML stepper (0.8NA, 0.6σ, partial coherence illuminations) with a binary reticle. The wafer was then post-exposure baked at 110° C. for 60 seconds. It was developed using a double-puddle develop process with 30 seconds for each puddle by using 0.263 N TMAH developer (Moses Lake's AD-10). Under these process conditions, the 140 nm line/space, 145 nm isolated space and 145 nm isolated line features were obtained.

EXAMPLE 9

NDBARC Formulation (N5) for Lithographic Evaluation

A terpolymer (P2) consisting of 45 mole % MAA, 30 mole % HEMA and 25 mole % ANTMA was dissolved in 50/50 wt. % PGME/GBL co-solvent with 5 wt. % triphenylsulfonium nonafluobutane-1-sulfonate (TPSN) and 0.535 wt. % of BB (all relative to polymer) to make a NDBARC solution with 2 wt. % of solid content. The resulting NDBARC solution was filtered through a 0.2 μm filter. The NDBARC solution was spin coated at 952 rpm on a 12-inch silicon wafer which was treated with HMDS at 120° C. for 45 sec. The NDBARC was post-applying baked at 120° C. for 60 seconds to form a 60 nm thick film. A JSR negative resist SUN7807 was then spin coated on the above mentioned wafer. The negative resist was post-applying baked at 80° C. for 60 seconds and exposed to 248 nm wavelength light on an ASML stepper (0.8NA, 0.6σ, partial coherence illuminations) with a binary reticle. The wafer was then post-exposure baked at 110° C. for 60 seconds. It was developed using a double-puddle develop process with 30 seconds for each puddle by using 0.263 N TMAH developer (Moses Lake's AD-10). Under these process conditions, the 140 nm line/space, 145 nm isolated space and 145 nm isolated line features were obtained.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A method of forming a lithographic structure, said method comprising:
    forming a stack, from bottom to top, of a negative developable bottom antireflective coating layer and a negative photoresist layer on a surface of a substrate, wherein said negative developable bottom antireflective coating layer comprises a polymer comprised of at least one carboxylic acid moiety, at least one cross-linkable aliphatic alcohol moiety, and at least one aromatic moiety, wherein said at least one cross-linkable aliphatic alcohol moiety includes 3-(2'-hydroxyethoxy)-1-adamantylmethacrylate covalently incorporated as at least one unit in the polymer;
    lithographically exposing a portion of said stack; and
    developing said stack, wherein unexposed portions of said stack are removed from above said surface of said substrate during development.

2. The method of claim 1, wherein said negative developable bottom antireflective coating layer further comprises a photoacid generator.

3. The method of claim 1, wherein said at least one carboxylic acid moiety comprises one or a combination of groups selected from acrylic acid methacrylic acid, 4-vinylbenzoic acid, 2-carboxyethyl acrylate, and mono-2-(methacryloyloxy)ethyl succinate covalently incorporated as at least one unit in the polymer.

4. The method of claim 1, wherein said at least one aromatic moiety comprises one or a combination of groups selected from 9-anthrylmethylmethacrylate, hydroxystyrene, and styrene covalently incorporated as at least one unit in the polymer.

5. The method of claim 1, wherein said at least one aromatic moiety comprises at least one chromophore moiety that absorbs light at a wavelength within a range of 100 nm to 400 nm.

6. The method of claim 1, wherein a molar percentage of said at least one carboxylic acid moiety relative to a sum of all molar percentages of said at least one carboxylic acid moiety, said at least one cross-linkable aliphatic alcohol moiety, and said at least one aromatic moiety is from 20% to 70%, and a molar percentage of said at least one cross-linkable aliphatic alcohol moiety relative to said sum is from 10% to 70%.

7. The method of claim 1, wherein said negative developable bottom antireflective coating layer is formed by coating a substrate with a solution including said polymer and a solvent in which said polymer is dissolved.

8. A structure comprising a stack, from bottom to top, of a negative developable bottom antireflective coating layer and a negative photoresist layer, wherein said stack is located on a surface of a substrate, and said negative developable bottom antireflective coating layer comprises a polymer comprised of at least one carboxylic acid moiety, at least one cross-linkable aliphatic alcohol moiety, and at least one aromatic moiety, wherein said at least one cross-linkable aliphatic alcohol moiety includes 3-(2'-hydroxyethoxy)-1-adamantylmethacrylate covalently incorporated as at least one unit in the polymer.

9. The structure of claim 8, wherein said at least one carboxylic acid moiety comprises one or a combination of groups selected from acrylic acid, methacrylic acid, 4-vinylbenzoic acid, 2-carboxyethyl acrylate, and mono-2-(methacryloyloxy)ethyl succinate covalently incorporated as at least one unit in the polymer.

10. The structure of claim 8, wherein said at least one aromatic moiety comprises one or a combination of groups selected from 9-anthrylmethylmethacrylate, hydroxystyrene, and styrene covalently incorporated as at least one unit in the polymer.

11. The structure of claim 8, wherein said at least one aromatic moiety comprises at least one chromophore moiety that absorbs light at a wavelength within a range of 100 nm to 400 nm.

12. A method of forming a lithographic structure, said method comprising:

forming a stack, from bottom to top, of a negative developable bottom antireflective coating layer and a negative photoresist layer on a surface of a substrate, wherein said negative developable bottom antireflective coating layer comprises a polymer comprised of at least one carboxylic acid moiety, at least one cross-linkable aliphatic alcohol moiety, and at least one aromatic moiety, wherein said at least one carboxylic acid moiety comprises one or a combination of groups selected from 4-vinylbenzoic acid, 2-carboxyethyl acrylate, and mono-2-(methacryloyloxy)ethyl succinate covalently incorporated as at least one unit in the polymer;

lithographically exposing a portion of said stack; and developing said stack, wherein unexposed portions of said stack are removed from above said surface of said substrate during development.

13. The method of claim 12, wherein said negative developable bottom antireflective coating layer further comprises a photoacid generator.

14. The method of claim 12, wherein said at least one cross-linkable aliphatic alcohol moiety comprises one or a combination of groups selected from 3-hydroxy-1-adamantylmethacrylate, 2-hydroxyethylmethacrylate, and 3-(2'-hydroxyethoxy)-1-adamantylmethacrylate covalently incorporated as at least one unit in the polymer.

15. The method of claim 12, wherein said at least one aromatic moiety comprises one or a combination of groups selected from 9-anthrylmethylmethacrylate, hydroxystyrene, and styrene covalently incorporated as at least one unit in the polymer.

16. The method of claim 12, wherein said at least one aromatic moiety comprises at least one chromophore moiety that absorbs light at a wavelength within a range of 100 nm to 400 nm.

17. The method of claim 12, wherein a molar percentage of said at least one carboxylic acid moiety relative to a sum of all molar percentages of said at least one carboxylic acid moiety, said at least one cross-linkable aliphatic alcohol moiety, and said at least one aromatic moiety is from 20% to 70%, and a molar percentage of said at least one cross-linkable aliphatic alcohol moiety relative to said sum is from 10% to 70%.

18. The method of claim 12, wherein said negative developable bottom antireflective coating layer is formed by coating a substrate with a solution including said polymer and a solvent in which said polymer is dissolved.

19. A structure comprising a stack, from bottom to top, of a negative developable bottom antireflective coating layer and a negative photoresist layer, wherein said stack is located on a surface of a substrate, and said negative developable bottom antireflective coating layer comprises a polymer comprised of at least one carboxylic acid moiety, of at least one cross-linkable aliphatic alcohol moiety, and at least one aromatic moiety, wherein said at least one carboxylic acid moiety comprises one or a combination of groups selected from 4-vinylbenzoic acid, 2-carboxyethyl acrylate, and mono-2-(methacryloyloxy)ethyl succinate covalently incorporated as at least one unit in the polymer.

20. The structure of claim 19, wherein said at least one cross-linkable aliphatic alcohol moiety comprises one or a combination of groups selected from 3-hydroxy-1-adamantylmethacrylate, 2-hydroxyethylmethacrylate, and 3-(2'-hydroxyethoxy)-1-adamantylmethacrylate covalently incorporated as at least one unit in the polymer.

21. The structure of claim 19, wherein said at least one aromatic moiety comprises one or a combination of groups selected from 9-anthrylmethylmethacrylate, hydroxystyrene, and styrene covalently incorporated as at least one unit in the polymer.

22. The structure of claim 19, wherein said at least one aromatic moiety comprises at least one chromophore moiety that absorbs light at a wavelength within a range of 100 nm to 400 nm.

\* \* \* \* \*